United States Patent [19]

Hornak et al.

[11] 4,117,347
[45] Sep. 26, 1978

[54] CHARGED SPLITTING METHOD USING CHARGE TRANSFER DEVICE

[75] Inventors: Thomas Hornak, Los Altos; Richard C. Lucas, Portola Valley, both of Calif.

[73] Assignee: Hewlett-Packard Company, Palo Alto, Calif.

[21] Appl. No.: 833,772

[22] Filed: Sep. 15, 1977

Related U.S. Application Data

[63] Continuation of Ser. No. 678,277, Apr. 19, 1976, abandoned.

[51] Int. Cl.$^2$ .................. G11C 19/28; H01L 29/78
[52] U.S. Cl. .................. 307/221 D; 357/24
[58] Field of Search ......... 357/24; 307/221 C, 221 D; 340/347 AD, 347 C

[56] References Cited

U.S. PATENT DOCUMENTS

| | | | |
|---|---|---|---|
| 3,777,186 | 12/1973 | Chang | 357/24 |
| 3,902,187 | 8/1975 | Engeler et al. | 357/24 |
| 3,906,488 | 9/1975 | Suarez-Gartner | 340/347 AD |
| 3,919,564 | 11/1975 | Walden | 357/24 |
| 3,930,255 | 12/1975 | Means | 357/24 |
| 4,070,667 | 1/1978 | Eichelberger | 357/24 |
| 4,072,939 | 2/1978 | Heller et al. | 307/221 D |

OTHER PUBLICATIONS

Sequin, "Two Dimensional Charge-Transfer Arrays", IEEE Journal of Solid-State Circuits, vol. SC-9, (6/74), pp. 134–142.
Sequin et al., Charge Transfer Devices, pp. 60–61, Academic Press, N. Y. (7/75).

Primary Examiner—William D. Larkins
Assistant Examiner—Gene M. Munson
Attorney, Agent, or Firm—Theodore S. Park

[57] ABSTRACT

A charge-splitting device and method include a plurality of charge cells coupled to receive a charge in response to being simultaneously clocked into a charge receiving state by an applied clock signal. The received charge is split into predetermined charge portions among the plurality of charge cells in proportions dependent upon the total number of cells, their relative capacitance and the magnitude and timing of the applied clock signal. The charge portions are again split and selectively summed to obtain highly accurate charge splitting ratios.

12 Claims, 9 Drawing Figures

CHARGED SPLITTING METHOD USING CHARGE TRANSFER DEVICE

This is a continuation of application Ser. No. 678,277, filed Apr. 19, 1976, now abandoned.

BACKGROUND AND SUMMARY

Shift registers constructed by serially coupling a plurality of charge cells in cascade to form an array are known in the art. Charge is typically transferred from cell to cell in the array in response to clock signals applied to cells of the array.

A received charge can be split among several cells by coupling a plurality of cells to receive the charge and simultaneously clocking selected cells into a charge receiving state.

With such an approach, the splitting ratio is influenced by the cell gate areas. If charge is to be split into two halves, for example, the charge receiving cells should have identical gate areas. Splitting inaccuracy results if the areas are mismatched. The split charges can be expressed as follows:

Charge in cell A = $pQ = (Q/2)(1 - \epsilon)$
Charge in cell B = $rQ = (Q/2)(1 + \epsilon)$, where $\epsilon$ represents a splitting error caused, for example, by layout or processing.

An improved charge splitting device made in accordance with the invention brings a quantity of charge Q into a splitting cell and splits the charge Q into two charge portions $pQ$ and $rQ$, $p$ and $Q$ being splitting coefficients where $p = \frac{1}{2}(1 - \epsilon)$ and $r = \frac{1}{2}(1 + \epsilon)$, $\epsilon$ being the error in charge splitting. The charge portion $rQ$ is stored and the charge portion $pQ$ is again divided by splitting cell into charge portions $p^2Q$ and $prQ$. The charge portion $prQ$ is equal to $(Q/4)(1 - \epsilon^2)$. The charge portions $p^2Q$ and $r^2Q$ are summed to produce the quantity $(Q/2)(1 + \epsilon^2)$. The charge portions $(Q/4)(1 - \epsilon^2)$ and $(Q/2)(1 + \epsilon^2)$ are more highly accurate representations of Q/4 and Q/2 than representations heretofore available by devices having an $\epsilon < 1$.

DESCRIPTION OF THE PREFERRED EMBODIMENT

Figure 1:
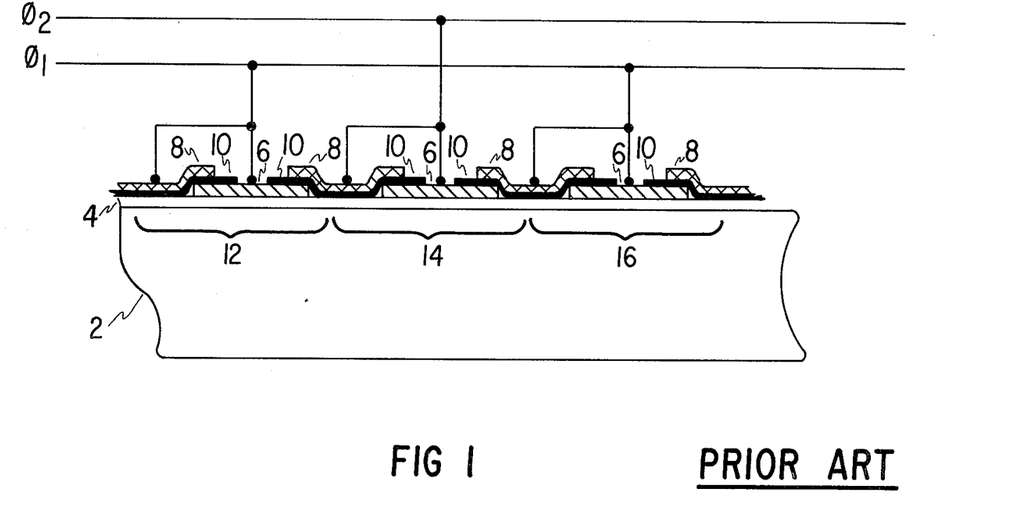
FIG. 1 is a drawing of a cross section of a conventional Charge Coupled Device shift register having a linear row of charge-coupled cells.
Figure 2:
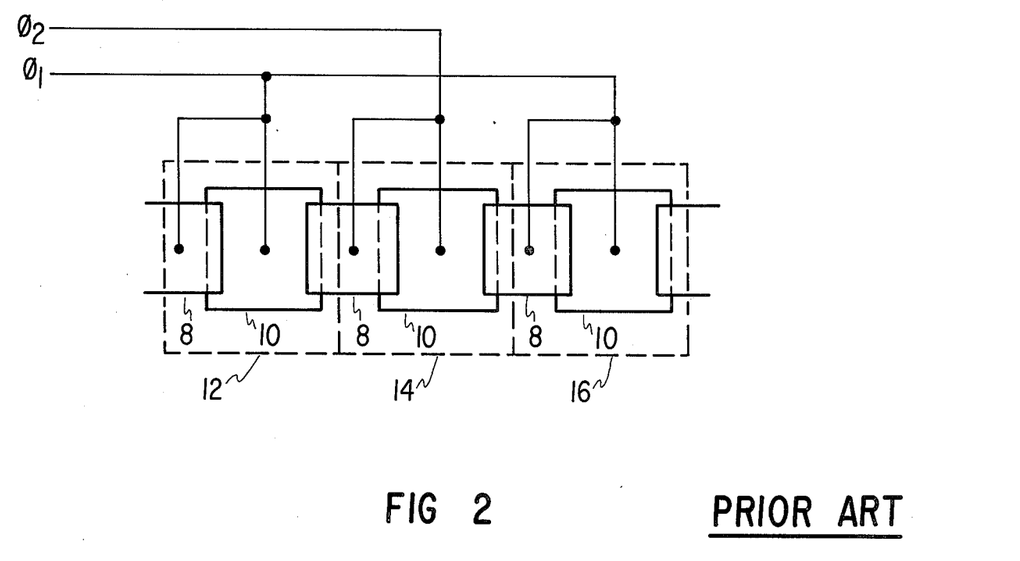
FIG. 2 is a diagrammatic top view of the charge-coupled device shift register of FIG. 1.

Referring to FIGS. 1 and 2, a conventional Charge Coupled Device (CCD hereinafter) shift register is shown. The register depicted is, for example, a two-phase device having directionality of charge transfer as described for example by J. E. Carnes and W. F. Kosonocky in the Apr. 1974 issue of *Solid State Technology* at pages 67-77 comprising a plurality of charge-coupled cells 12, 14 and 16 operated by a two-phase clock producing clock pulse signal $\phi_1$ and $\phi_2$. The CCD shift register is typically constructed of a silicon substrate 2 doped with a p-type impurity. The silicon substrate is covered by a first layer 4 of $S_iO_2$. On top of the $S_iO_2$ layer are deposited first gate electrodes 6 of, for example, polysilicon, and second gate electrodes 8 of, for example, aluminum, isolated from each other by a second layer 10 of $S_iO_2$. The second gate electrodes overlap the gaps between the first gate electrodes. Adjacent first and second electrodes are interconnected as shown and the interconnections are alternately coupled to receive clock phase signals $\phi_1$ and $\phi_2$. FIG. 2 illustrates charge transfer cells 12, 14 and 16 formed thereby.

Figure 3:
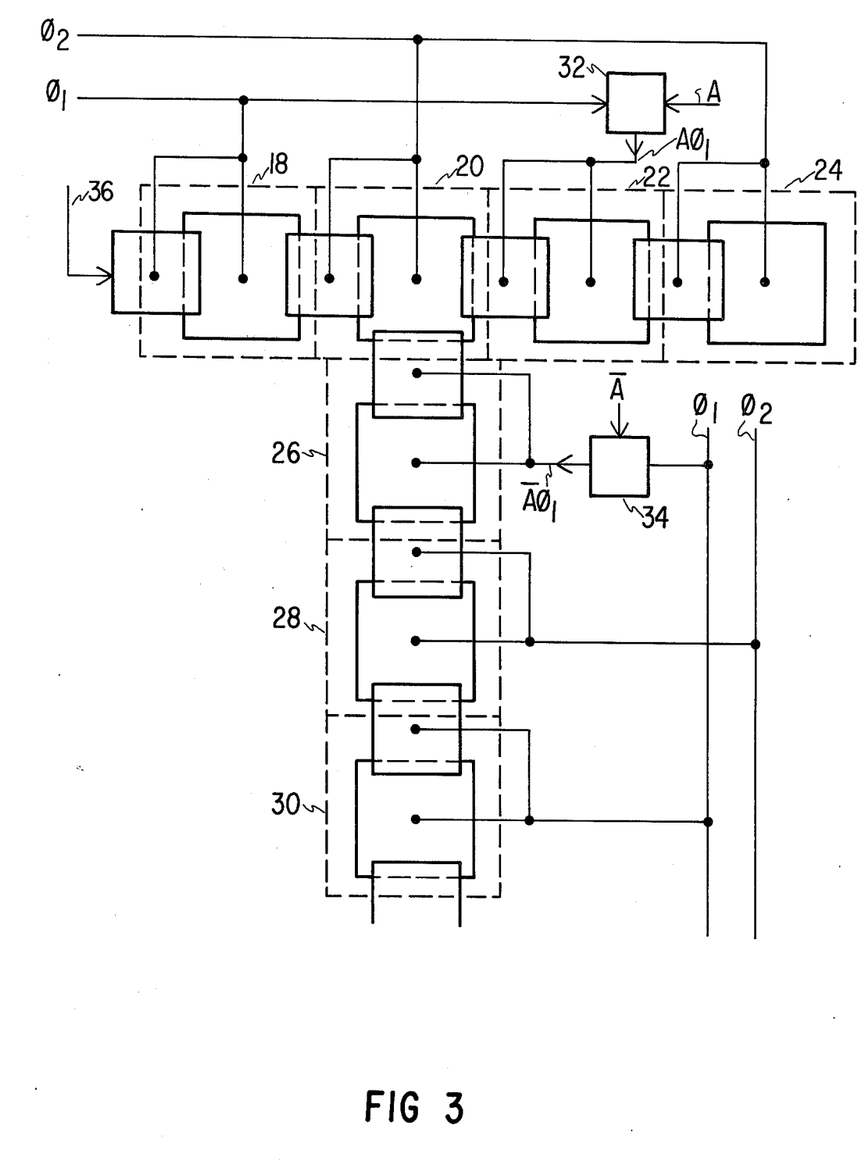
FIG. 3 is a diagrammatic top view of a charge-branching cell in combination with two shift registers.

Referring to FIG. 3, a diagrammatic top view of a charge-branching cell in combination with two CCD shift registers is shown. Conventional CCD cells 18, 20, 22 and 24 are coupled in cascade in a first linear array similar to known CCD shift registers. The charge-branching cell comprises cells 20, 22 and 26. Conventional CCD cells 26, 28 and 30 are coupled in cascade in a second linear array similar to known CCD shift registers. Cell 20, however, is coupled to two adjacent cells 22 and 26, cell 22 being in the first array and cell 26 being in the second array. Gate electrodes of cells 18, 20, 24, 28 and 30 are connected to receive clock pulses $\phi_1$ and $\phi_2$ as in the conventional shift registers illustrated in FIGS. 1 and 2. Cells 22 and 26 have their first and second gate electrodes coupled to receive one of two conditional clock pulses, $A\phi_1$ and $\overline{A}\phi_1$ by means of logic 32 and 34, respectively. $A\phi_1$ is, for example, representative of a logic AND function of the logic variable A with the phase signal $\phi_1$. Similarly, $\overline{A}\phi_1$ is, for example, representative of a logic AND function of the logic variable $\overline{A}$ with the phase signal $\phi_1$. Copending U.S. patent applications entitled "Charge Coupled Analog to Digital Converter" and Ser. No. 677,944, now abandoned, and "Charge Coupled Digital to Analog Converter" Ser. No. 677,955, now allowed by Thomas Hornak describe suitable logic and said patent applications are hereby fully incorporated by reference. For A = logic zero, the conditional clock phase signal $A\phi_1$ is zero and no clock phase $\phi_1$ pulses are applied to the gate electrodes of cell 22. Since A = logic zero, $\overline{A}$ = logic one and cell 26 does receive clock phase signal $\phi_1$. The charge residing in cell 20 will therefore be clocked into cell 26. No charge will enter cell 22 as long as its first and second gates are kept at zero voltage. Further clock pulses $\phi_1$ and $\phi_2$ propagate charge from cell 26 down the array formed by cells 28 and 30.

For A = logic one and $\overline{A}$ = logic zero, cell 26 has a zero gate voltage and will not receive any charge from cell 20. The gates of cell 22 will, however, be clocked positively by clock pulses $\phi_1$ and cell 22 will receive charge from cell 20. Charge 36 applied to the left of the first linear array in FIG. 3 is selectively branched to the second linear array or to the first linear array by application of the logic variables A and $\overline{A}$.

The charge-branching cell comprising cells 20, 22 and 26 thereby provides selective branching of charge. Although branching to only two arrays has been described, extension to a larger plurality of branching is possible.

Figure 4:
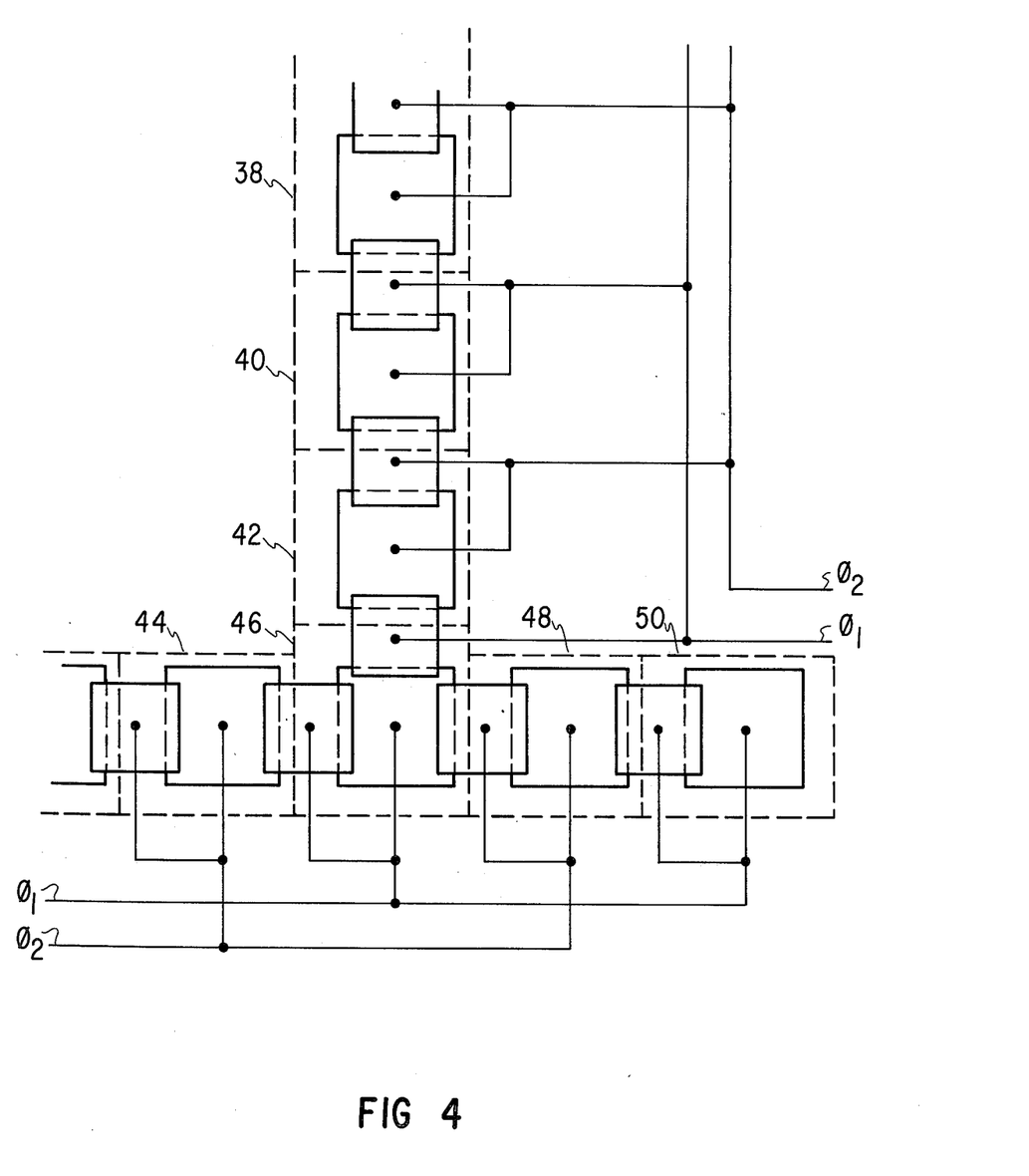
FIG. 4 is a diagrammatic top view of a charge-summing cell in combination with two shift registers.
Figure 5:
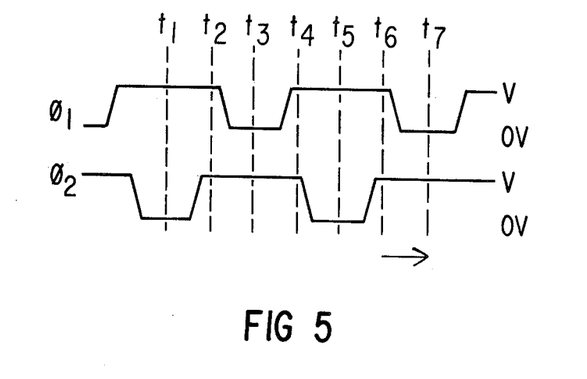
FIG. 5 is a timing diagram of clock pulse signals $\phi_1$ $\phi_2$.

Referring to FIG. 4, a diagrammatic top view of a charge-summing cell is shown. CCD cells 38, 40 and 42 are coupled in cascade in a first linear array similar to that of a conventional CCD shift register. Similarly, CCD cells 44, 46, 48 and 50 are coupled in cascade and form a second array. Cell 46 is coupled to receive charge from cell 42 in the first array and from cell 44 in the second array. Referring to FIG. 5, timing diagrams for clock pulses $\phi_1$ and $\phi_2$ are shown which can be used for the devices illustrated in FIGS. 1 through 4. With reference to FIG. 4, assume that at time $t_3$ indicated in FIG. 5 cells 42 and 44 are each holding charge and that the gate electrodes of cell 46 are at zero volts. At time $t_4$ the three gate electrodes of cell 46 are driven positive by clock pulse signal $\phi_1$, with cell 46 still not containing charge. Between time $t_4$ and $t_5$ clock pulse signal $\phi_2$ goes to zero volts while clock pulse signal $\phi_1$ remains high. The charges from cells 42 and 44 are both transferred into cell 46 and thereby summed in cell 46. The summed charge is then clocked into cell 48 when clock signal $\phi_1$ goes to zero volts between times $t_6$ and $t_7$ shown in FIG. 5. Although a charge-summing cell is described for summing charge from two sources, extension to larger pluralities is within the scope of the invention.

Figure 6:
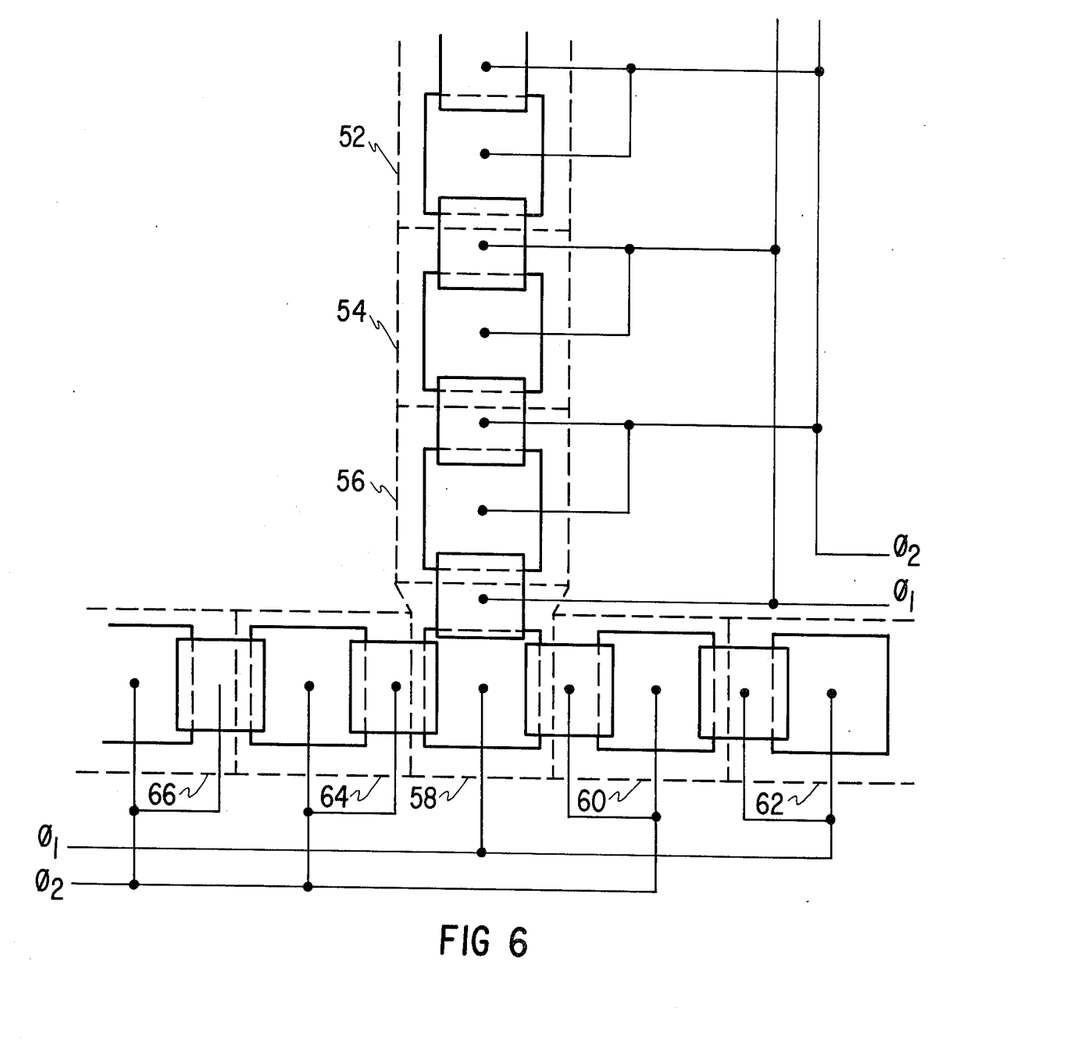
FIG. 6 is a diagrammatic top view of a charge-splitting cell in combination with two shift registers.

Referring to FIG. 6, a charge-splitting cell is shown in combination with two CCD shift registers. The charge-splitting cell comprises CCD cells 58, 60 and 64. A first CCD shift register comprises cells 52, 54, 56 and 68 are coupled in cascade, a second shift register comprises cells 60 and 62, coupled in cascade, and a third shift register comprises cells 64 and 66. Cell 58 receives charge from cell 56. The charge residing in cell 58 at time $t_1$ indicated in FIG. 5 is transferred to cells 60 and 64 between times $t_2$ and $t_3$ in response to cells 60 and 64 being simultaneously clocked into a charge receiving state by clock pulse signal $\phi_2$. The distribution of charge between cells 60 and 64 is proportional among other things to the gate area ratios of cells 60 and 64. If, for example, cells 60 and 64 are substantially identical, the charge will be equally split between cells 60 and 64.

Different splitting ratios can be achieved by coupling a greater plurality of cells to cell 58, for example, three identical cells provide a splitting ratio of ⅓. Variations can be achieved by varying cell gate area size in combination with varying the plurality and also by cascading charge-splitting cells as described in referenced and fully incorporated copending applications entitled "Charge Coupled Analog to Digital Converter" and "Charge Coupled Digital to Analog Converter" by Thomas Hornak.

Figure 7:
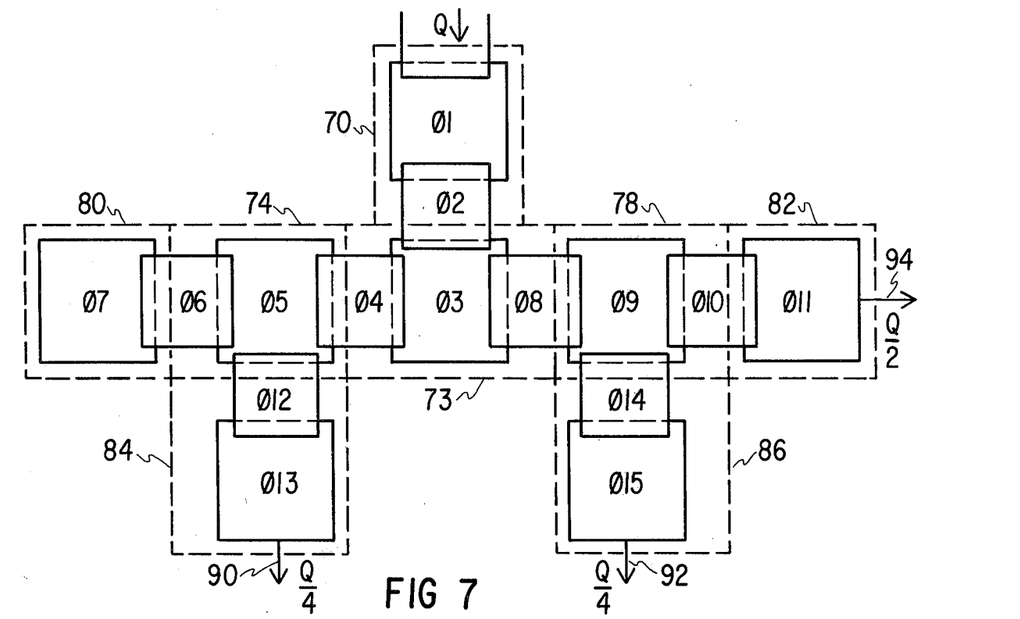
FIG. 7 is a diagrammatic top view of an improved charge splitting cell made in accordance with the invention.

Referring to FIG. 7, an improved charge splitting device is shown. A charge Q to be split is applied to cell 70. The charge Q is transferred to cell 73 and from there split into cells 74 and 78 as two portions, the first portion being $pQ$, $p$ equal to a quantity $\frac{1}{2}(1 - \epsilon)$, and the second portion being $rQ$, $r$ equal to a quantity $\frac{1}{2}(1 + \epsilon)$, and $\epsilon$ being representative of proportional splitting error due to masking or processing errors and the like. The charge portion $pQ$ is transferred from cell 74 to cell 80 and the charge portion $rQ$ is transferred from cell 78 to cell 73 and split into cells 74 and 78 as charge portions $r^2Q$ and $prQ$, respectively; the charge portion $pQ$ is recalled from cell 80 and split into a second charge portion $prQ$ and a charge portion $p^2Q$ by cells 73, 74, 78, and the charge portions $p^2Q$ and $r^2Q$ summed in cell 82 to produce the charge portion $(Q/2)(1 + \epsilon^2)$ as described more fully below.

Figure 8:
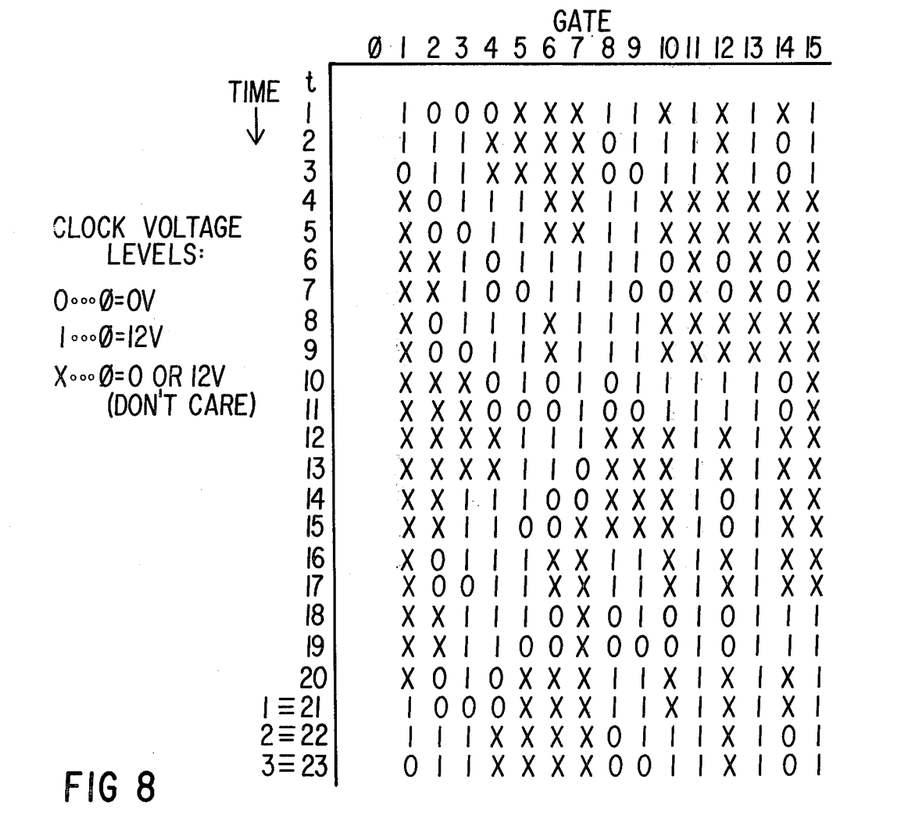
FIG. 8 is a timing diagram illustrating appropriate clock signals for use with the embodiment depicted in FIG. 7.

Referring to the timing diagram shown in FIG. 8 and the diagram of the preferred embodiment depicted in FIG. 7, at time $t_1$ the charge Q is underneath gate $\phi_1$.

At $t_2$ gate $\phi_3$ is ready to accept charge Q but charge Q is still confined under gate $\phi_1$.

At $t_3$ charge Q is transferred from underneath gate $\phi_1$ to underneath gate $\phi_3$.

At $t_4$ gates $\phi_5$ and $\phi_9$ are ready to accept charge but charge Q is still confined under gate $\phi_3$.

At $t_5$ a charge portion $pQ$ equal to $(Q/2)(1 - \epsilon)$ is transferred from gate $\phi_3$ of cell 73 to gate $\phi_5$ of cell 74 and a charge portion $rQ$ equal to $(Q/2)(1 + \epsilon)$ is transferred from gate $\phi_3$ of cell 73 to gate $\phi_9$ of cell 78.

At $t_6$ gate $\phi_7$ of cell 80 is ready to accept charge from gate $\phi_5$ of cell 74 and gate $\phi_3$ of cell 73 is ready to accept charge from gate $\phi_9$ of cell 78.

At $t_7$ charge portion $pQ$ is transferred from cell 74 to cell 80 and charge portion $rQ$ is transferred from cell 78 to cell 73.

At $t_8$ gate $\phi_5$ of cell 74 and gate $\phi_9$ of cell 78 are ready to accept charge from gate $\phi_3$ of cell 73 but charge portions $pQ$ and $rQ$ are still underneath gates $\phi_7$ and $\phi_3$.

At $t_9$ charge portion $rQ$ is split into charge portions $r^2Q$ underneath gate $\phi_9$ of cell 78 and the first charge portion $prQ$ underneath gate $\phi_5$ of cell 74.

At $t_{10}$ gate $\phi_{13}$ of cell 84 and gate $\phi_{11}$ of cell 82 are ready to accept the first charge portion $prQ$ from gate $\phi_5$ of cell 74 and charge portion $r^2Q$ from gate $\phi_9$ of cell 78, respectively. The first charge portion $prQ$ is stored underneath gate $\phi_5$, $R^2Q$ is stored underneath gate $\phi_9$ and $pQ$ is stored underneath gate $\phi_7$.

At $t_{11}$ the first portion $prQ$ equal to $(Q/4)(1 - \epsilon^2)$ is transferred from gate $\phi_5$ of cell 74 to gate $\phi_{13}$ of cell 84 and made available as a first output 90. Charge portion $r^2Q$ is transferred from gate $\phi_9$ of cell 78 to gate $\phi_{11}$ of cell 82. Charge portion $pQ$ is still stored under $\phi_7$.

At $t_{12}$ gate $\phi_5$ of cell 74 is ready to accept charge portion $pQ$ from gate $\phi_7$ of cell 80 and the first charge portion $prQ$ and charge portion $^2Q$ are still stored under gates $\phi_{13}$ and $\phi_{11}$.

At $t_{13}$ charge portion $pQ$ is transferred from under gate $\phi_7$ of cell 80 to under gate $\phi_5$ of cell 74.

At $t_{14}$ gate $\phi_3$ of cell 73 is ready to accept charge from gate $\phi_5$ of cell 74.

At $t_{15}$ charge portion $pQ$ is transferred from gate $\phi_5$ of cell 74 to gate $\phi_3$ of cell 73.

At $t_{16}$ gates $\phi_5$ of cell 74 and $\phi_9$ of cell 78 are ready to accept charge from gate $\phi_3$ of cell 73.

At $t_{17}$ charge portion $pQ$ is split into charge portions $p^2Q$ and a second $prQ$, $p^2Q$ being underneath gate $\phi_5$ of cell 74, the second $prQ$ underneath gate $\phi_9$ of cell 78. The first charge portion $prQ$ is still stored under gate $\phi_{13}$ and charge portion $r^2Q$ is still stored under gate $\phi_{11}$ (see $t_{11}$).

At $t_{18}$ gate $\phi_{15}$ of cell 86 is ready to accept $prQ$ from gate $\phi_9$ of cell 78 and gate $\phi_3$ of cell 73 is ready to accept $p^2Q$ from gate $\phi_5$ of cell 74.

At $t_{19}$ the second charge portion $prQ$ equal to $(Q/4)(1 - \epsilon^2)$ is transferred from gate $\phi_9$ of cell 78 to gate $\phi_{15}$ of cell 86 and is available as a second output 92. Charge portion $p^2Q$ is transferred from gate $\phi_5$ of cell 74 to gate $\phi_3$ of cell 73.

At $t_{20}$ gate $\phi_9$ of cell 78 is ready to accept charge portion $p^2Q$ from gate $\phi_3$ of cell 73.

At $t_{21}$ charge portion $p^2Q$ is transferred from under gate $\phi_3$ of cell 73 to under gate $\phi_9$ of cell 78. Gate $\phi_1$ of cell 70 can now accept a new charge to be split.

At $t_{22}$ gate $\phi_{11}$ of cell 82 is still storing charge portion $r^2Q$ (since $t_{11}$) and is now ready to accept in addition charge portion $p^2Q$ from gate $\phi_9$ of cell 78. Gate $\phi_3$ of cell 73 is ready to accept a new charge from gate $\phi_1$ of cell 70.

At time $t_{23}$ charge portion $p^2Q$ is transferred from underneath gate $\phi_9$ of cell 78 to underneath gate $\phi_{11}$ of cell 82 where it is summed with charge portion $r^2Q$. The sum equals $(Q/4)(1-\epsilon)^2 + (Q/4)(1+\epsilon)^2 = (Q/2)(1+\epsilon^2)$ and is available as a third output 94. If $\epsilon$ is less than one, the charge portions available as outputs 90, 92 and 94 are therefore more accurate representations of Q/4, Q/4, and Q/2, respectively: $(Q/4)(1-\epsilon^2)$, $(Q/4)(1-\epsilon^2)$ and $(Q/2)(1+\epsilon^2)$, than can be obtained from a given splitting cell.

Figure 9:
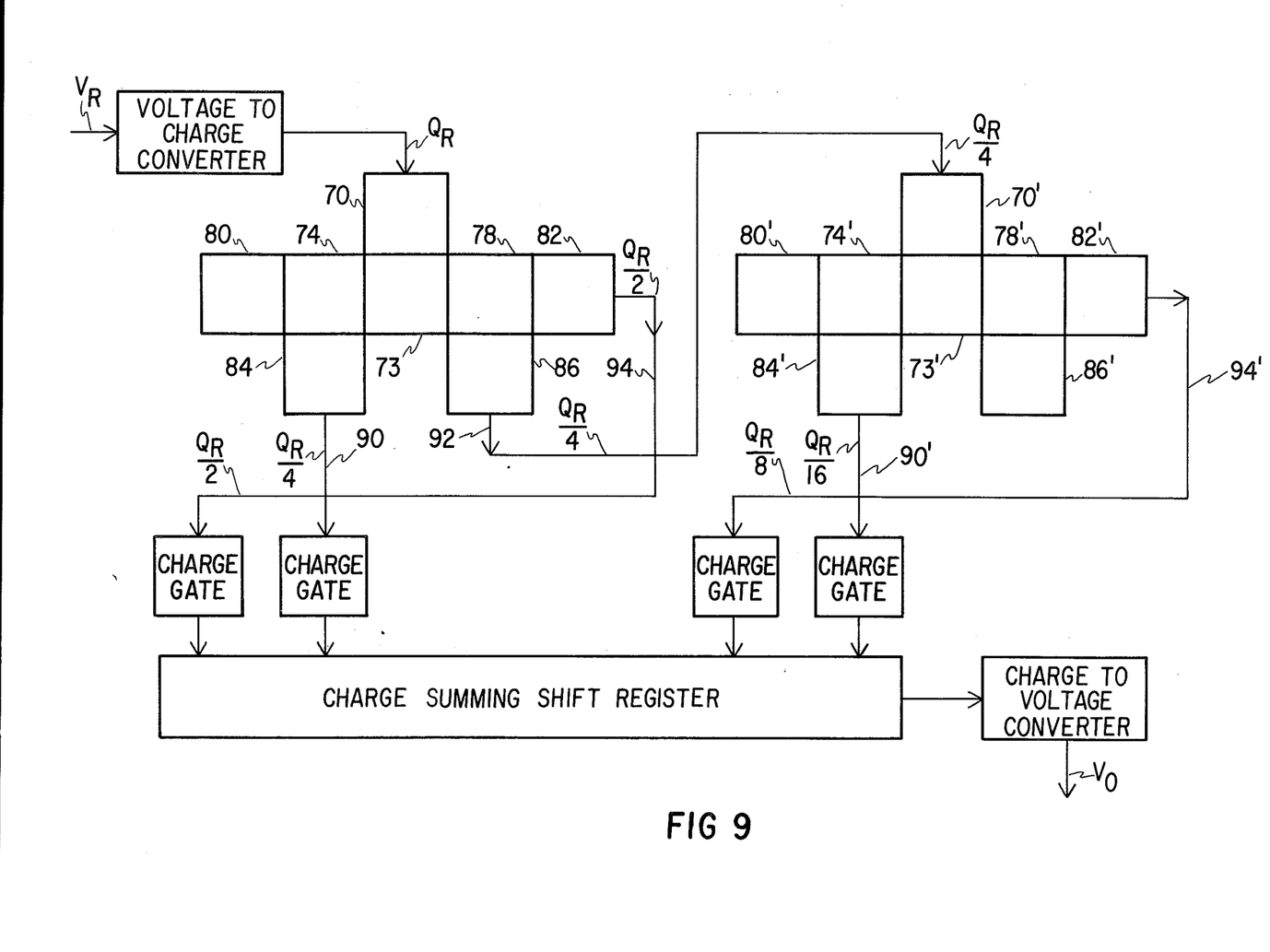
FIG. 9 is a digital to analog converter utilizing charge splitting cells constructed as shown in FIG. 7.

Referring to FIG. 9, a digital to analog converter utilizing the embodiment of FIG. 7 in the manner taught by the copending patent application titled "Charge Coupled Digital to Analog Converter" by Thomas Hornak is shown.

We claim:

1. A method for splitting charge comprising the steps of:
   splitting a quantity of charge Q into a charge portion $pQ$ and a charge portion $rQ$, $p$ being $\frac{1}{2}(1-\epsilon)$, $r$ being $\frac{1}{2}(1+\epsilon)$, by a charge splitting means having a splitting error of $\epsilon$, $\epsilon$ being a fraction less than one;
   splitting the charge portion $pQ$ into a charge portion $p^2Q$ and a charge portion $rpQ$ by said charge splitting means;
   splitting the charge portion $rQ$ into a charge portion $r^2Q$ and a charge portion $prQ$ by said charge splitting means;
   combining the charge portions $p^2Q$ and $r^2Q$; and
   applying the combined charge portions $p^2Q$ and $r^2Q$ as an output representative of one-half the value of charge Q.

2. A method for splitting charge comprising the steps of:
   splitting a quantity of charge Q into a first plurality of first charge portions;
   splitting the first plurality of first charge portions into a second plurality of second charge portions;
   combining a plurality of the second plurality of second charge portions to form a combined charge portion; and
   applying the combined charge portion as an output.

3. A method as in claim 2 wherein each of the first plurality of first charge portions is substantially equal to the same nominal fractional portion of charge Q.

4. A method as in claim 2 wherein each of the second plurality of second charge portions is substantially equal to the same nominal fractional portion of charge Q.

5. A method as in claim 2 wherein the first and second charge portions are each split by a selected splitting cell.

6. A method for splitting charge comprising the steps of:
   applying a quantity of charge Q to a charge splitting cell;
   splitting the charge Q by means of said charge splitting cell into two charge portions $pQ$ and $rQ$, $p$ and $r$ being splitting coefficients where $p = \frac{1}{2}(1-\epsilon)$ and $r = \frac{1}{2}(1+\epsilon)$, $\epsilon$ being a number representing error of said charge splitting cell;
   splitting the charge portion $pQ$ by means of said charge splitting cell into charge portions $p^2Q$ and $prQ$;
   splitting charge portion $rQ$ by means of said splitting cell into charge portions $r^2Q$ and $rpQ$; and
   combining charge portions $p^2Q$ and $r^2Q$ to form a quantity of charge representative of one-half the quantity of charge Q.

7. A method as in claim 6 comprising the additional steps after splitting charge Q of:
   removing charge portions $pQ$ and $rQ$ from said splitting cell;
   storing the charge portion $pQ$; and
   storing the charge portion $rQ$.

8. A method as in claim 6 wherein the step of splitting the charge portion $pQ$ comprises the steps of:
   applying charge portion $pQ$ to said charge splitting cell; and
   splitting the charge portion $pQ$ by said charge splitting cell into charge portions $p^2Q$ and $prQ$.

9. A method as in claim 8 comprising the additional steps after splitting charge portion $pQ$ of:
   removing the charge portions $p^2Q$ and $prQ$ from said splitting cell; and
   storing the charge portion $p^2Q$.

10. A method as in claim 9 wherein the step of splitting the charge portion $rQ$ comprises the steps of:
    applying charge portion $rQ$ to said charge splitting cell; and
    splitting the charge portion $rQ$ by said charge splitting cell into charge portions $r^2Q$ and $rpQ$.

11. A method as in claim 10 comprising the additional steps after splitting charge portion $rQ$ of:
    removing the charge portions $r^2Q$ and $rpQ$ from said charge splitting cell; and
    storing the charge portion $r^2Q$.

12. A method as in claim 11 wherein the step of combining charge portions $p^2Q$ and $r^2Q$ comprises the steps of:
    applying the charge portions $p^2Q$ and $r^2Q$ to a charge summing cell; and
    combining the charge portions $p^2Q$ and $r^2Q$ in the charge summing cell.

* * * * *

UNITED STATES PATENT AND TRADEMARK OFFICE
CERTIFICATE OF CORRECTION

PATENT NO. : 4,117,347
DATED : September 26, 1978
INVENTOR(S) : Thomas Hornak, Richard C. Lucas It is certified that error appears in the above-identified patent and that said Letters Patent are hereby corrected as shown below:

In the Title, delete "CHARGED" and insert -- CHARGE --;

Column 1, line 1, delete "CHARGED" and insert -- CHARGE --;

Column 1, line 57, before "$\phi_2$" insert -- and --;

Column 2, line 47, after "Converter" delete "and";

Column 3, line 34, delete "68" and insert -- 58 --;

Column 4, line 34, delete ". R" and insert -- , r --;

Column 4, line 43, delete "$^2Q$" and insert -- $p^2Q$ --;

Column 6, line 15, claim 6, before "error" insert -- splitting --.

Signed and Sealed this

Nineteenth Day of December 1978

[SEAL]

Attest:

RUTH C. MASON
Attesting Officer

DONALD W. BANNER
Commissioner of Patents and Trademarks